US006053397A

United States Patent [19]

Kaminski

[11] Patent Number: 6,053,397

[45] Date of Patent: Apr. 25, 2000

[54] METHOD FOR THE MANUFACTURE OF MICRO SOLDER BUMPS ON COPPER PADS

[75] Inventor: Janusz Kaminski, Calw, Germany

[73] Assignee: Hewlett-Packard Company, Palo Alto, Calif.

[21] Appl. No.: 08/935,170

[22] Filed: Sep. 24, 1997

[30] Foreign Application Priority Data

Nov. 12, 1996 [EP] European Pat. Off. .............. 96118107

[51] Int. Cl.[7] .......................... B23K 35/12; B23K 31/02; B23K 1/20

[52] U.S. Cl. .................... 228/254; 228/118; 228/180.22; 219/121.75

[58] Field of Search .............................. 228/259, 6.1, 6.2, 228/118, 179.1, 180.1, 180.21, 180.22, 188, 189; 219/121.68, 121.69, 121.75, 121.79

[56] References Cited

U.S. PATENT DOCUMENTS

| | | | |
|---|---|---|---|
| 4,328,410 | 5/1982 | Slivinsky et al. | 219/121 |
| 4,940,881 | 7/1990 | Sheets | 219/121.69 |
| 5,024,372 | 6/1991 | Altman et al. | 228/248 |
| 5,262,614 | 11/1993 | Katayama et al. | 219/121.69 |
| 5,406,701 | 4/1995 | Pepe et al. | 29/840 |
| 5,660,321 | 8/1997 | Ishida et al. | 228/248.1 |
| 5,841,102 | 11/1998 | Noddin | 219/121.71 |

FOREIGN PATENT DOCUMENTS

| | | |
|---|---|---|
| 307766A1 | 3/1989 | European Pat. Off. . |
| 359862A1 | 3/1990 | European Pat. Off. . |
| WO90/07792 | 12/1989 | WIPO . |

OTHER PUBLICATIONS

Patent Abstracts of Japan JP 6112275 Apr. 22, 1994.
Patent Abstracts of Japan JP 63156343 Jun. 29, 1988.
Patent Abstracts of Japan JP 8031979 Feb. 02, 1996.
European Search Report, EP 96 11 8107, Apr. 04, 1997.

*Primary Examiner*—Patrick Ryan
*Assistant Examiner*—Kiley Stoner

[57] ABSTRACT

Method for the manufacture of micro solder bumps, in which holes are structured by means of laser ablation in a mask, in order to produce solder bumps higher than the mask thickness. Through the additional use of a wobble plate in the production of trough-like stepped holes, micro solder bumps with an even larger volume can be produced.

5 Claims, 1 Drawing Sheet

7
6
2
1

METHOD FOR THE MANUFACTURE OF MICRO SOLDER BUMPS ON COPPER PADS

FIELD OF THE INVENTION

The invention relates to a method for the manufacture of micro solder bumps on copper pads placed on a dielectric support material, it being necessary to ensure the minimum volumes of the solder bumps necessary for the connection of electronic components.

BACKGROUND OF THE INVENTION

From the manufacture of printed circuit boards the use of photolithographic methods is known, in order to produce a desired conductor pattern on an insulating support material. When producing soldered bumps on copper pads a triple photoresist film is applied and subsequently the holes over the copper pads are opened by exposure and development. After filling the holes by means of a solder paste and subsequent heating or reflow, soldered bumps are formed on the copper pads. The remaining resist material is then removed.

The disadvantage of this prior art method is that it is not possible to produce soldered bumps which are higher than the resist film, because the solder volume in the opening above the copper pad cannot be raised. In addition, it is not possible to reliably produce in this way diameters smaller than 100 μm, because the resolution of a triple laminated resist with an approximate height of 80 μm is no longer adequate for such small structures. Another problem is represented by the minimum diameter of the solder globules in the paste, because in the case of smaller diameters the microholes can no longer be filled in an optimum manner.

Therefore the problem of the invention is to produce large-volume solder bumps, which have a diameter smaller than 100 μm and following the reflow process are higher than the mask used.

According to the invention this problem is solved by the features of the main claim. Further advantageous developments form the subject matter of the subclaims.

SUMMARY OF THE INVENTION

According to the invention a resist or a polymer film, e.g. polyimide, is applied to a support material and serves as a mask layer and covers the support material and the copper pads. Next over the copper pads the mask material is removed by laser ablation, the hole diameter on the base corresponding to the copper pad diameter and is smaller than 100 μm and the diameter of the hole is increased towards the opening of the latter. This leads to a conical hole above the copper pad, so that a larger volume is made available for the solder paste. Thus, during the following reflow process, it is possible to produce soldered bumps with a greater height than the mask layer. The mask layer can have a height of 45 to 55 μm, preferably 50 μm, whilst the height of the solder bumps is 65 to 75 μm, preferably 70 μm.

More solder volume is required to produce even higher soldered bumps. Therefore the holes in the mask layer must be so structured that they can receive even more solder paste, but towards the bottom still only have an opening with the desired copper pad diameter. According to a particularly preferred embodiment laser-produced stepped holes are obtained. Firstly larger diameter holes are produced, but they do not pass to the copper pad. Then the smaller holes with the subsequent copper pad diameter are produced. The production of the larger diameter holes takes place in a particular embodiment of the method, through the use of a wobble plate, a trough-like hole being produced just above the copper pad. Subsequently and without using the wobble plate, the remaining mask layer, limited to the copper pad diameter, is removed. The operation of a wobble plate and its arrangement are known e.g. from U.S. Pat. No. 4,940,881. When producing laser-generated stepped holes without a wobble plate by reflections on the wall of the hole an outer ring is formed round the copper pad, so that in the reflow process solder paste can remain attached.

Thus, this method makes it possible to produce soldered bumps, which are higher than their diameter and this more particularly applies with so-called micro solder bumps having a diameter smaller than 100 μm. Thus, an adequate volume for soldering is made available for the subsequent bump of the electronic component, even with such small solder bump pads.

BRIEF DESCRIPTION OF THE DRAWINGS

The invention is described in greater detail hereinafter relative to embodiments and the attached drawings, wherein show.

DETAILED DESCRIPTION OF THE INVENTION

Figure 1:
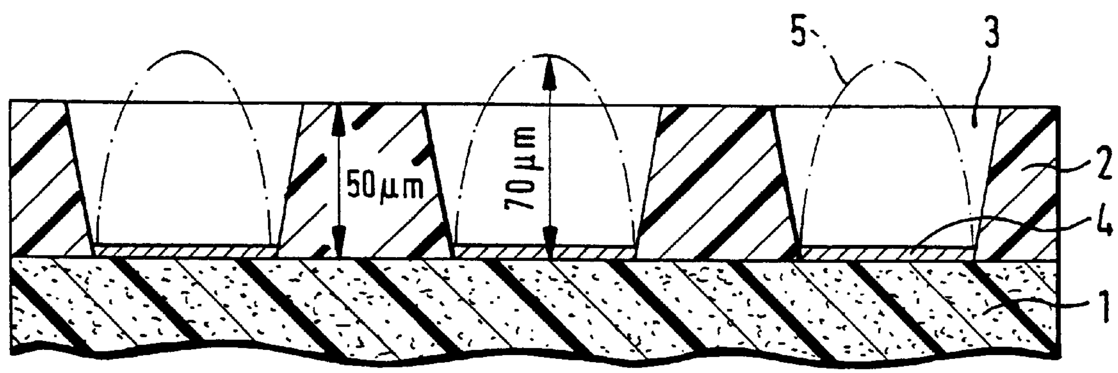
FIG. 1 illustrates laser-generated, conical holes in a mask.

FIG. 1 shows the completely hardened support substrate 1 of an insulating material with a mask layer 2 positioned above it and which comprises two resist films or a polymer film, e.g. polyimide. The thickness is approximately 50 μm. The holes 3 produced in the mask layer by means of a laser, e.g. an excimer laser, have a conical shape. The diameter at the base corresponds to the diameter of the copper pad 4 for the solder bump 5. As a result of the increased volume of the holes compared with vertical side walls, the solder bumps 5 project over the height of the mask layer 2.

Figure 2A:
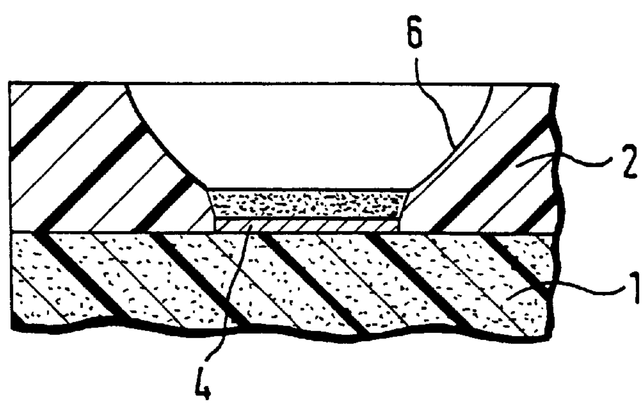
FIGS. 2*a* and 2*b* illustrate the production of laser-generated, trough-like holes by means of a wobble plate.
Figure 2B:
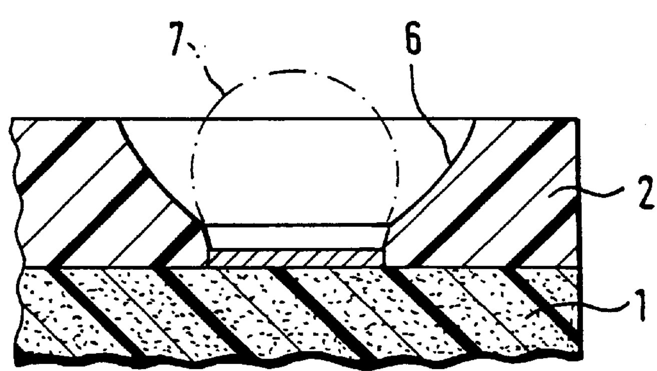

FIG. 2 shows the manufacture of trough-like stepped holes 6 in order to produce even higher solder bumps 7. In the first step according to FIG. 2*a* and whilst interposing a wobble plate (cf. U.S. Pat. No. 4,940,881) a trough-like hole is produced. In the next step and whilst eliminating the wobble plate, the mask material over the copper pad is removed by laser ablation precisely corresponding to the subsequent solder bump. Following the generally known filling of the holes with solder paste and subsequent reflow, large-volume soldered bumps on pads of 100 μm can be produced.

The subsequent removal of the mask takes place in known manner. The depth of the holes 6 is controlled by controlling the laser energy quantity on the mask material 2 and support material 1. This energy can e.g. be influenced by a suitable control of the number of pulses on the material or by controlling the time during which the material is exposed to the laser light.

I claim:

1. Method for the manufacture of micro solder bumps on copper pads which are placed on a support substrate, comprising the following steps:

a) applying a resist or polymer film onto the support substrate as a mask layer, b) producing holes in the mask layer by laser ablation over the copper pads, a diameter of the holes at a base corresponding to a diameter of the copper pad and being smaller than 100 μm, and a diameter above the copper pad being larger than the copper pad, c) filling the holes with solder paste to a level of an upper surface of said mask layer and reflowing the solder to create solder bumps, each solder bump having a height that extends above an uppermost surface of the mask layer, and d) removing the mask layer.

2. Method according to claim 1, wherein the solder bumps produced take a partial spherical form.

3. Method according to claim 1, wherein the height of the mask layer is 45 to 55 μm, and the height of the solder bumps is 65 to 75 μm.

4. Method according to claim 1, wherein in step b) firstly holes with a larger diameter than the copper pad are produced, but which do not pass through to said copper pad and subsequently holes are produced with the copper pad diameter.

5. Method according to claim 4, wherein by using a wobble plate to just above the copper pad a trough-like hole is produced and subsequently, but without using the wobble plate, the remainder of the mask layer, limited to the diameter of the copper pad, is removed.

* * * * *